United States Patent [19]

Gärtner et al.

[11] Patent Number: 4,713,259
[45] Date of Patent: Dec. 15, 1987

[54] METHOD FOR THE GLOW-DISCHARGE-ACTIVATED REACTIVE DEPOSITION OF ELECTRICALLY CONDUCTIVE MATERIAL FROM A GASEOUS PHASE

[75] Inventors: Georg F. Gärtner, Aachen; Peter A. Janiel, Würselen; Hans-Jürgen Lydtin, Stolberg, all of Fed. Rep. of Germany

[73] Assignee: U.S. Philips Corporation, New York, N.Y.

[21] Appl. No.: 856,917

[22] Filed: Apr. 28, 1986

[30] Foreign Application Priority Data

May 4, 1985 [DE] Fed. Rep. of Germany ....... 3516078

[51] Int. Cl.$^4$ ............................................. B05D 3/06
[52] U.S. Cl. ...................................... 427/39; 156/637; 156/646; 156/663; 156/667; 427/105; 427/107; 427/126.2; 427/126.3; 427/237; 427/239; 427/292; 427/309; 427/398.1
[58] Field of Search ................ 427/237, 238, 39, 105, 427/107, 126.2, 292, 309, 398.1, 239, 126.3

[56] References Cited

U.S. PATENT DOCUMENTS 4,262,035  4/1981  Jaeger et al. ................... 427/237 X Primary Examiner—Bernard D. Pianalto
Attorney, Agent, or Firm—Paul R. Miller

[57] ABSTRACT

For the reactive deposition of tubular bodies of electrically conductive material from a flowing gas phase on a tubular substrate, a glow discharge 11 is produced between an inner electrode 6 and an outer electrode 2, one of which is constructed so as to be tubular and serves as a substrate. It is ensured that the electrodes 2, 6 are not short-circuited by growing conductive surface layers so that the glow discharge 11 extinguishes. Furthermore, the electrically conductive coating on the electrode 6 which does not function as the substrate electrode is interrupted in an insulating manner to locally limit the glow discharge 11. For example, by a gas barrier the deposit of an electrically conducting material on the insulation can be avoided. The glow discharge 11 is reciprocated during the deposition process.

18 Claims, 4 Drawing Figures

METHOD FOR THE GLOW-DISCHARGE-ACTIVATED REACTIVE DEPOSITION OF ELECTRICALLY CONDUCTIVE MATERIAL FROM A GASEOUS PHASE

The invention relates to a method for the reactive deposition of tubular bodies of an electrically conductive material from a flowing gaseous phase on a tubular substrate, in which a glow discharge is produced between an inner electrode and an outer electrode, one of which is tubular and serves as a substrate.

A method of a similar type is known from the British published Patent Application GB No. 20 30 180. In the method described in this Patent Application a wire-shaped inner electrode is used extending concentrically through the interior of a tubular outer electrode. After igniting the glow discharge a layer of an electrically conductive material is just deposited on the inside of the outer electrode. After a short period of time however, thin electrically conductive layers may also start to grow between the electrodes, causing a short-circuit so that the glow discharge extinguishes. In this British Patent Application no measures are indicated which could prevent a short-circuit. Consequently the known method is not so suitable for producing layers having thicknesses which exceed a few micrometers, for example layers of 100 $\mu$m thick. Moreover, the layers thus produced may have a non-uniform thickness profile over the substrate tube length caused by different plasma densities, temperature imhomogeneities, and by material depletion of the gaseous phase.

It is the object of the invention to provide a method for the glow-discharge-activated reactive deposition of self-supporting tubular bodies of electrically conductive mono- and in particular multicomponent material having wall thicknesses of 20 $\mu$m or more. It should be ensured in particular that the electrodes are not short-circuited by conductive layers to prevent the glow discharge from being extinguished thereby.

According to the invention, this object is achieved in that in a method of the type mentioned in the opening paragraph (a) a controlled reciprocating movement occurs of the inner electrode relative to the outer electrode, (b) a localized glow discharge zone is produced between the inner electrode and the outer electrode and is maintained during the deposition, (c) measures are taken to prevent the formation of electrically conductive layers on electrically insulating structural parts in the reaction space, and (d) the temperature in the substrate area is kept constant at a low value at which the thermal deposition rate is small as compared with the deposition rate with glow discharge.

As a result of the controlled reciprocating movement of the inner electrode, a uniform layer thickness profile over the whole stroke of the electrode movement is obtained. The velocity of the electrode movement may be f.i. in the order of 20 s per period corresponding to 1 cm/s.

The object of a localized glow discharge zone and hence a spatial concentration of plasma energy is to reduce the taper before and after stroke reversal points and to limit the deposition to the area of the relative electrode movement. Taper is to be understood to mean herein deposition ranges with insufficiently constant geometric properties and/or with insufficiently constant material composition.

In order to maintain a stable localized glow discharge zone during longer durations of deposition, electrically insulating structural parts are used in discrete places in the reaction space. The growth of an electrically conductive layer on such parts, which would lead to flash-overs and extinction of the glow discharge, is prevented by suitable measures to be described in detail hereinafter.

The temperature in the substrate area is kept constant, for example, by heat conduction and/or local heating or cooling. By keeping the temperature constant it is achieved that no temperature inhomogeneities arise which would result in a locally different thickness profile and (in a multicomponent system) in a locally different concentration profile. A rapid temperature compensation over the substrate surface moreover prevents the local heating by the plasma energy of the substrate surface from interfering by thermal activation with the action of the plasma (ionisation and dissociation).

The temperature in the substrate area is kept at a low value at which the thermal deposition rate is small as compared with the deposition rate with glow discharge. Any temperature effects on the total deposition rate are suppressed by this measure.

All in all, according to the method of the invention, electrically conductive layers consisting of one or several components are obtained in constant thickness and concentration profiles over the entire tube length in thicknesses $\geq 20$ $\mu$m, typically 50–100 $\mu$m, which could otherwise not be realised in this homogeneity.

In preferred embodiments of the method according to the invention the electrically conductive material is deposited either on the inside of the outer electrode serving as substrate and hence constructed in the form of a tube, or on the outside of the inner electrode serving as substrate and hence constructed in the form of a tube.

In the measures (b) and (c) the plasma power consumed in the glow discharge is preferably adjusted with respect to the thermal power input or output to be so high that the composition of deposited electrically conductive multicomponent material is determined substantially by the relative amounts of constituents to be deposited in the gaseous phase. This is advantageous as compared to a thermal CVD method in which the deposition conditions are different for each component. Consequently, in the codeposition of several substances according to the invention an additional degree of freedom to adjust desired mixing ratios is obtained. In fact, certain concentration ratios are only possible in this way. For example, the temperature in the substrate area can be kept constant at a value at which the thermal deposition rate is at most 1/10th of the deposition rate with glow discharge. The formation of electrically conductive layers on electrically insulating structural parts in the reaction space can be prevented by the following measures:

($\alpha$) by either forming grooves in the electrically insulating structural parts, or forming grooves which at their inside partly consist of electrically insulating material. The grooves are constructed so that during the reactive deposition they are nearly filled only by gaseous reaction final products ("dead volume") and/or ($\beta$) by suitable choice of the material of which electrically insulating structural parts consist at least at the surface so that by an etching reaction of the flowing gaseous phase with the surface of the parts a gas is formed and/or (γ) an additional insert gas rinsing.

By these modifications of the method, particularly stable, localised and effective gas barriers are obtained.

The spatial limitations of the glow discharge zone (measure (b)) is preferably adjusted by the following measures:

(α) design and geometrical proportioning of the electrode not serving as a substrate and its surface distances to the tubular electrode according to Paschen's law and/or (β) insulation envelope of the current supply to the inner electrode, in so far as it does not serve as a substrate, optionally while (γ) forming at least one circumferential groove in the insulation envelope or a groove of which at least part of the inside consists of electrically insulating material which groove is constructed so that during the reactive deposition it is filled substantially only by gaseous reaction final products, and/or (δ) a length of the metallic surface of the electrode not serving as a substrate which in the direction of the tube is less than one third of the length of the substrate.

Paschen's law, see f.e. the "Enzylkopädie Naturwissenschaft und Technik" Vol. 4 (Weinheim 1981), p. 3197 says that the ignition voltage $U_z$ of a gas discharge between two flat extended electrodes depends only on the distance between the electrodes d and on the gas pressure p according to $$U_z = f(p \cdot d)$$

i.e. $U_z$ depends only on the overall particle number between the electrodes per area. $U_z$ has a minimum at $p \cdot d \approx 10^{-5}$ b·m of approximately 250 to 300 V (according to the type of gas). At higher values of p·d the ignition voltage increases since the number of the impacts of the electrons grows and hence per impact less energy is available for ionisation. At smaller values of p·d on the contrary the number of the ionising impacts decreases since some of the electrons reach the opposite electrode without colliding with neutral gas atoms. If possible, the discharge then looks for a longer path on which the product p·d reaches a value at which the ignition voltage is lower.

The circumferential groove in the insulation envelope of the inner electrode or of the groove of which the inside partly consists of electrically insulating material is preferably so wide and deep that a continuous growth with an electrically conductive material is avoided, for example, 1 mm wide and 40 mm deep. The groove in this case is consequently bent, i.e. first it extends at right angles to the surface and then parallel to the surface of the envelope. In case only part of the inside of the groove consists of electrically insulating material at least the bottom of the groove should be electrically insulating.

In measure (a) the inner electrode is preferably reciprocated along the outer electrode in the tube direction while being moved periodically or aperiodically. A periodic movement occurs, for example, by a function generator having a periodic voltage variation which determines required values for speed and reversal points for a direct current motor whose rotational movement is converted into a linear movement via a drive. The periodic movement produces a uniform thickness and concentration profile over the stroke length.

An aperiodic movement occurs, for example, by an external determination of instantaneous required values by a computer basing, for example, on further process data. The further conversion occurs as described above. A non-periodic or nearly periodic movement serves for the compensation of longer term drifts and for compensation of edge tapers. It is also possible to vary the speed of the motor from cycle to cycle.

Furthermore it is advantageous that in measure (d) the entire tubular substrate, hence the substrate tube, is kept at a substantially constant temperature by individual, separately controllable heating and cooling zones, respectively, and/or by choice of a material or a device with rapid heat compensation in spite of the local heat load in the glow discharge zone. A device with rapid heat compensation is, for example, a heat pipe which is provided concentrically around the substrate inside the furnace jacket, is hollow on the inside and is filled with an alkali metal vapour. The rapid temperature compensation by the substrate tube has for its result that the strong additional heating occurring in the glow discharge zone is rapidly delivered to the outer zones, and as a result of this, at a substrate temperature which is constant and low everywhere, i.e. a thermal deposition no longer plays a role. Moreover the temperature-dependent expansion and shrinkage occurs rather uniformly.

The term "tubular" used hereinbefore is to be understood to mean that the substrate and the outer electrode generally have a cross-section in the form of a closed flat curve. The cross-section is, for example, circular, elliptical or polygonal. The substrate tube is preferably chosen to be cylindrical, i.e. of circular cross-section, and the electrode that does not serve as the substrate is chosen to be rotationally symmetrical with the substrate tube, optionally consisting of several individual tubes, being stacked one on top of the other, and with the electrode not serving as a substrate being provided coaxially. The substrate is, for example, a cylinder on which the conductive material is deposited. In the case of non-conductive substrate material, a thin conductive layer is first provided by a thermal CVD method. In the case of inner coating the inner electrode is in the interior of the cylinder, for example, as a disc on a coaxial electrode supply which is screened by an insulator, such as a cylinder consisting of glass or alumina-ceramic. Another form of the inner electrode is, for example, a short rod having a varying diameter which is greatest in the direction of the current supply is greatest. By these embodiments it is achieved that the glow discharge zone according to Paschen's law is formed around the electrode head in a small area.

The inner electrode is preferably polarised as an anode and the outer electrode as a cathode; or in other words the inner electrode is preferably at a positive potential with respect to the outer electrode. As a result of this it is achieved that the rate of deposition on the substrate tube is greater than the rate of deposition on the inner electrode with a ratio of approximately 2:1.

In order to adapt the discharge conditions, i.e. current-voltage characteristics and ignition voltage, as a function of pressure and electrode spacing toward high plasma power, sufficiently high pressure and sufficiently high discharge currents, it is advantageous to add a non-reacting gas, such as a helium-group gas to the flowing gaseous phase. For this purpose argon is to be particularly considered because of its low ignition voltage and because it may be used as a carrier gas.

In the deposition of a multicomponent material the flowing gas atmosphere preferably comprises at least a halide or carbonyl compound of tungsten, molybdenum, tantalum, niobium, rhenium, hafnium, iridium, osmium, platinum, rhodium, ruthenium and/or zirconium and as a further constituent at least a metal-organic compound of an element of group III B of the periodic system together with a non-reacting gas, i.e. a helium-group gas and in case a halide is present: hydrogen.

The method according to the invention may be used without any difficulty for the manufacture of metal cylinders, such as those in particular consisting of refractory metals (for example, tungsten or tungsten with 5% $ThO_2$) which due to their brittleness cannot be processed to thin-walled metal cylinders or only with difficulty. Instead of tungsten, molybdenum, rhenium, tantalum, niobium and the like can also be manufactured in the form of thin-walled metal cylinders. A simultaneous deposition of tungsten, molybdenum, etc. with other metals and metal-oxides, for example, the rare earths metals or their oxides or $ThO_2$, $ZrO_2$, $HfO_2$ can also be carried out particularly advantegeously.

In a preferred embodiment of the method according to the invention, in particular for the manufacture of cylindrical cathodes for electron tubes, tungsten hexafluoride, hydrogen and at least one metal organic thorium compound are added to the flowing gas phase and an electrically conductive material consisting of tungsten, tungsten carbide and thorium oxide is deposited. As metal organic thorium compounds are to be considered, for example, thorium heptafluorodimethyloctanedionate, $Th(fod)_4$, or thorium trifluoroacetylacetonate, $Th(tfa)_4$. Instead of tungsten hexafluoride, molybdenum hexafluoride or rhenium hexafluoride can be used.

In a preferred embodiment of the method according to the invention the non-reacting gas i.e. such as a helium-group is added by two separately controllable gas flow paths, in which gas supply is carried out through a preheated saturator filled with a powdered metal organic thorium compound. In this manner it is achieved that both the carrier gas flow and the overall helium-group gas flow can be adjusted separately.

The mechanical thermal stability (low temperature ductility) of thorium doped tungsten cylinders is further increased by adding to the gas mixture as a further dopant rhenium hexafluoride.

For the manufacture of self-supporting cylinders of an electrically conductive material, in particular tungsten, a tubular substrate is preferably used which consists of pyrographite, quartzglass, molybdenum or copper; and the tubular substrate is removed after deposition is completed. Copper can be removed by etching or evaporation.

It is particularly advantageous to use as a substrate a quartz glass cylinder which is precoated thermally by pyrolysis of a metal organic thorium compound with a thin intermediate layer of thorium carbide and carbon which does not adhere to tungsten, on which the electrically conductive material may then be deposited and after completion of the deposition and cooling is simply drawn out of the quartz glass tube as a self-supporting cylinder having, for example, a wall thickness of 30 μm.

In case during the deposition process the gas composition is changed, it is advantageous not to interrupt the glow discharge. An interruption of the glow discharge may cause delamination of the deposited layer.

BRIEF DESCRIPTION OF THE DRAWING

The invention will now be described in greater detail with reference to a drawing and a few embodiments. In the drawing.

DETAILED DESCRIPTION OF THE DRAWING

Figure 1:
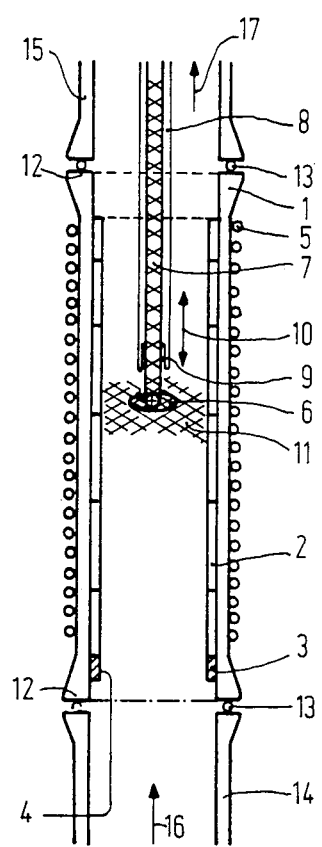
FIG. 1 is a diagrammatic sectional view of a device for carrying out glow discharge-activated reactive depositions.

FIG. 1 is a diagrammatic sectional view of a part of the reaction chamber. In a quartz glass or stainless steel reactor tube 1, substrate cylinders 2 are stacked coaxially on a copper ring 3. An electric connection 4 for the cathode leads from the copper ring 3 by a vacuum-current leadthrough (not shown) to the minus terminal of a direct current mains apparatus (also not shown). Heating windings 5 are additionally wound around the reactor tube 1 to keep the substrate cylinder 2 or substrate tubes, at a defined temperature. This temperature may be 500° C. or higher. To obtain this temperature a heating power of 280 to 300 W may be required. Coaxially in the tube axis is an inner electrode 6 which normally is connected as an anode and which can be moved along said axis by a linear drive (not shown). The inner electrode 6 constructed as a disc is is screwed onto an assembly rod 7 of stainless steel (V2A) which simultaneously serves as a current supply. The assembly rod 7 is enveloped by a screening cylinder 8 of quartz glass or alumina ceramic. Immediately in front of the electrode (anode) 6, an approximately 1 mm wide and several centimeters deep circumferential groove 9 starts which groove prevents a continuous electrically conductive growth. The screening cylinder 8 at least in the neighbourhood of anode 6 is surrounded by an outer cylinder (not indicated in the Figure). This cylinder consists of a material which prevents peeling off of electrical conducting deposit. A material of this kind is for example electrographite. The mobility of the anode 6 with assembly rod 7 and screening cylinder 8 is indicated by a double arrow 10.

A glow discharge 11 is formed between the anode 6 and the substrate cylinders 2. The reactor tube 1 is connected by glass flanges 12 with sealing rings 13 of a heat-resistant synthetic resin to the remainder of the apparatus 14, 15. The gas supply indicated by an arrow 16 occurs on the side remote from the anode, and the gas outlet indicated by an arrow 17 occurs on the anode side.

Figure 2:
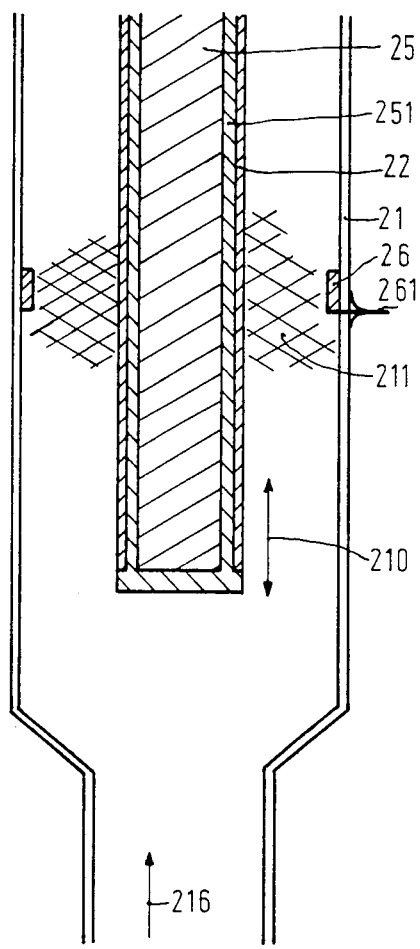
FIG. 2 is a diagrammatic sectional view of a modified embodiment of the device shown in FIG. 1.

FIG. 2 shows diagrammatically a part of a device for outside coating. FIG. 2 will be described in greater detail in example 3.

Figure 3:
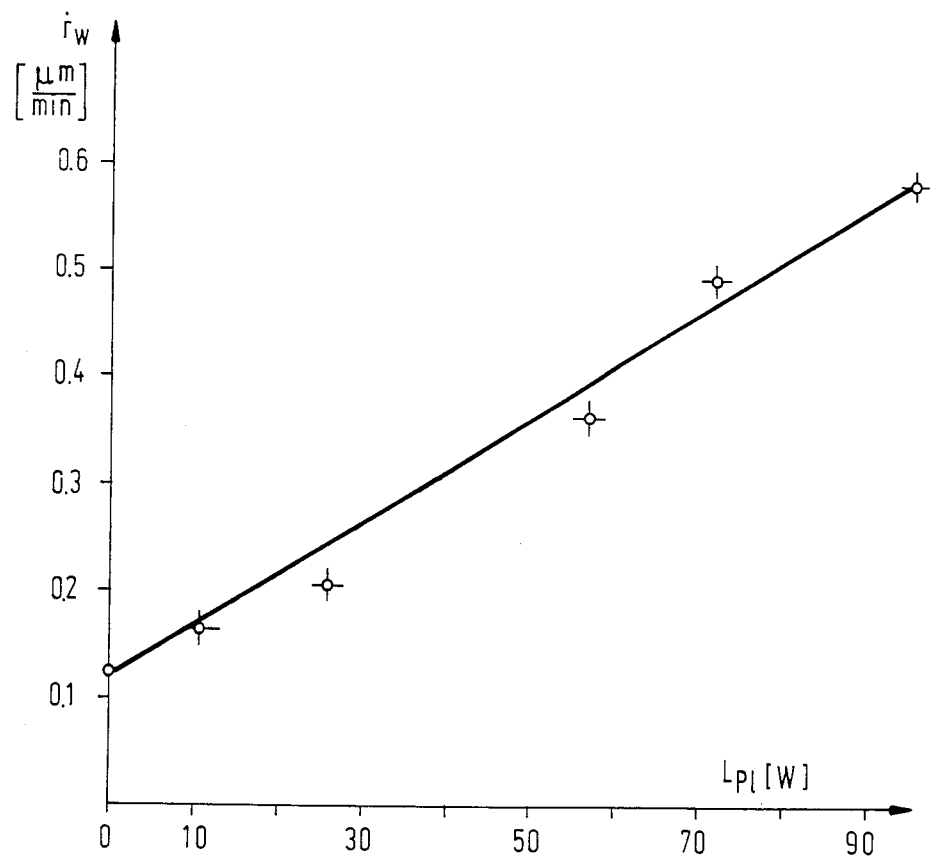
FIG. 3 is a diagram showing the tungsten deposition rate as a function of the plasma power and FIG. 4 is a diagram showing the tungsten deposition rate as a function of the reciprocal substrate temperature with constant plasma power.

FIG. 3 shows the tungsten deposition rate $r_W$ as a function of the plasma power $L_{Pl}$ with otherwise constant parameters (overall pressure $P_{ges}=12$ hPa, flow rates $\dot{Q}(WF_6)=50$ cm$^3$/min, $\dot{Q}(H_2)=400$ cm$^3$/min, $\dot{Q}(AR)=362$ cm$^3$/min, and substrate temperature of approximately 412° C.). The experimental result is an approximately linear increase of the growth rate $\dot{r}_W$ with increasing plasma power in the range from 0 to 100

W. Between about 200 to 250 Watt saturation is attained (not indicated in this Figure).

Figure 4:
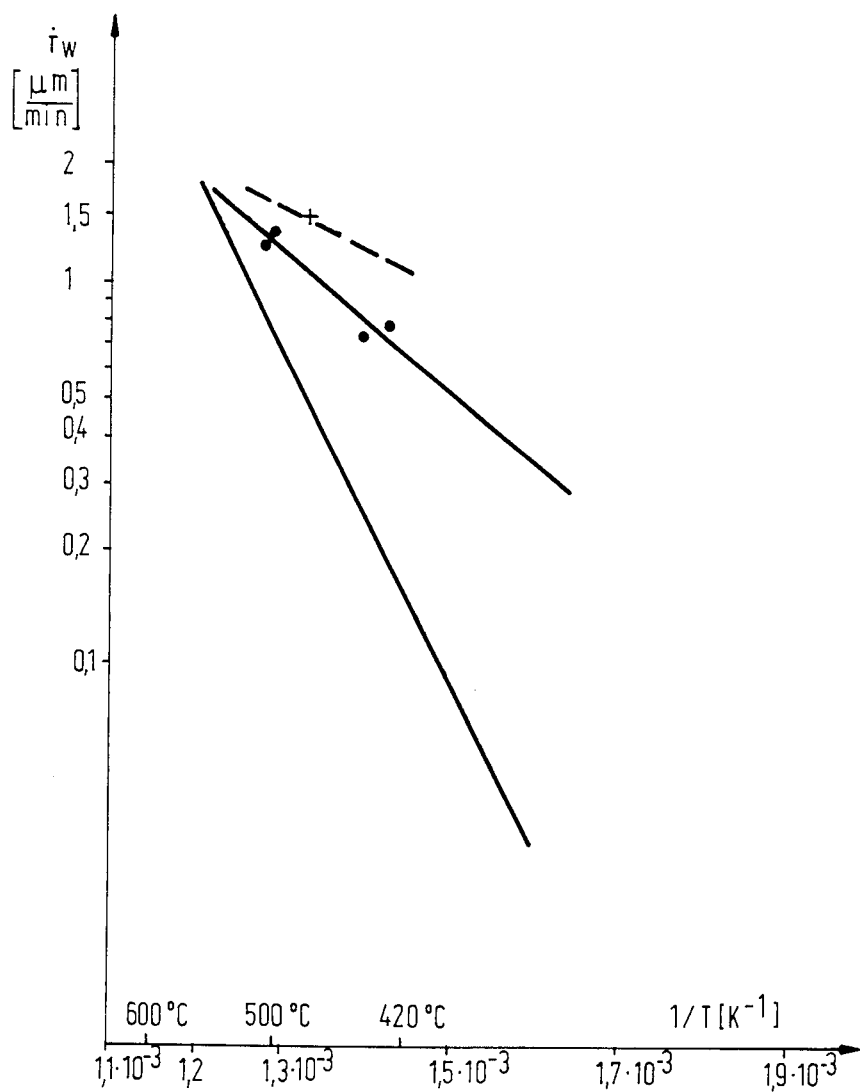

In FIG. 4 the tungsten deposition rate is plotted as a function of reciprocal substrate temperature at otherwise constant parameters and $p_{gas}=10$ hPa in the Arrhenius equation. The lower straight line relates to a purely thermal deposition ($L_{Pl}=0$ W), the central line relates to a deposition with a plasma power of 90 Watt and the top line relates to a plasma power of 156 Watt. An ever smaller temperature dependence occurs with increasing plasma power and an increasing growth rate $\dot{r}_W$, which in all corresponds to a strong decrease of the activation energy for the surface reaction.

EXAMPLE 1.

The parameter values indicated with reference to FIG. 3 are used for the manufacture of tungsten cylinders having a wall-thickness of 50 μm. At a substrate temperature of 410° C., a plasma power of 150 W and a growth rate of 1 μm per minute an overall duration of the coating is achieved in 50 minutes.

The 5 cm deep circumferential groove 9 in the anode screening envelope 8 during the glow-discharge-activated reaction is filled nearly exclusively by the reaction end product HF and by $H_2$ (which is present in excess in the reaction space). A deposition of tungsten on the inside of the gap occurs only in the area of the entrance aperture of the gap and not in the depth of the gap 9.

Pyrographite cylinders (inside diameter and height approximately 28 cm, wall thickness 250 μm) are used as substrate cylinders. Upon cooling the tungsten cylinder shrinks more strongly than the pyrographite cylinder. The tungsten cylinder, given a smooth inner surface of the pyrographite cylinder and after removal of tungsten grown around the edge, for example, by means of an NdYAG laser cutter, can hence simply be drawn out of the pyrographite cylinder.

As an alternative, copper substrate cylinders are used of the same dimensions. Since copper upon cooling shrinks on tungsten it is etched away after the coating process by means of an etching solution consisting of 5 g $FeCl_3$ in 100 ml water and 30 ml HCl in a few hours.

EXAMPLE 2.

For the manufacture of tungsten cylinders comprising approximately 5% $ThO_2$, the following parameters are applied: gas flows: $\dot{Q}(WF_6)=25$ cm$^3$/min, $\dot{Q}(H_2)=400$ cm$^3$/min, $\dot{Q}(Ar)=62$ cm$^3$/min, $\dot{Q}_2(Ar)=300$ cm$^3$/min, $Q_2(Ar)$ indicates the argon flow through a saturator containing Th(fod)$_4$. The overall pressure in the reactor is 10 hPa and the substrate temperature is adjusted at 370° C. With a discharge current of 0.3 A a plasma power of approximately 170 Watt is obtained. The saturator temperature is adjusted at 125° C. From the vapour pressure of Th(fod)$_4$, which at this temperature amounts to 0,24 hPa, the argon flow $\dot{Q}(Ar)$ and the overall pressure in the saturator of approximately 20 hPa, a Th(fod)$_4$ mass flow of 3.6 cm$^3$/min is obtained. After a coating duration of 2 hours a cylinder inner coating of approximately 50 μm thickness is obtained.

As substrates are used quartz glass cylinders which have been coated with a thin intermediate layer (at most of a thickness of 1 μm) consisting of thorium and carbon by a ten minute lasting Th(fod)$_4$ pyrolysis at approximately 450° C. wall temperature. On this intermediate layer which prevents the strong surface adhesion of tungsten on the quartz glass, a 3 μm thick tungsten layer is then provided. The duration of coating is also 10 minutes.

After the overall coating duration of 200 minutes and cooling the cylinders at room temperature, the thoriated tungsten cylinders can simply be drawn out of the quartzglass substrate cylinders since the coefficients of linear thermal expansion of $5\times10^{-7}K^{-1}$ for quartz glass $4.5\times10^{-6}K^{-1}$ for tungsten differ considerably.

EXAMPLE 3.

Example 2 is repeated with the proviso that a further dopant ReF$_6$ is added to the gas-mixture. The gas-mixture consists in this case of 50 cm$^3$/min WF$_6$, 400 cm$^3$/min H$_2$, 400 cm$^3$/min Ar, 2 cm$^3$/min ReF$_6$ and about 2 cm$^3$/min Th(tfa)$_4$. The plasma power amounts to 280 Watt. The layers produced in this manner consists of tungsten doped by 4% by weight of Rhenium and about 4% by weight of ThO$_2$. In this way a material is produced which as compared to a ThO$_2$ doped tungsten material has the advantage of an increased ductility at lower temperatures e.g. room temperature. The ThO$_2$ dopant increases the heat stability and ductility at temperatures of use of 2000 K.

EXAMPLE 4

In the device shown in FIG. 2 having a reactor wall 21 of quartz glass, an outer coating of a cylindrical tube 22 (or several substrate cylinders stacked one on top of the other) of stainless steel with an electrically conductive layer is carried out. The cylindrical tube or the substrate cylinders are positioned on a ceramic-insulated heating rod 25. Between the heating rod and the cylindrical tube an outer jacket 251 of stainless steel (V2A) is also provided. As a result of this the substrate can be preheated and a rapid heat compensation can be carried out.

The cylindrical tube 22 (outside diameter 3 cm) is connected as a cathode for a glow discharge 211. As anode serves a good centered coaxial ring 26 of stainless steel, tungsten or molybdenum with an anode supply 261. When the ring 26 has a diameter of 7 cm, it is present at a distance of 2 cm from the cylinderical tube 22 and from the substrate cylinders, respectively.

The substrate cylinder structure and the heating rod 25 are reciprocated by means of a vacuum-shifting device (not shown) and a linear drive (also not shown)—after igniting the glow discharge in the gas-mixture as in Example 1,—relatively to the stationary anode ring 26, which is indicated by a double arrow 210. The velocity of movement is 20 sec per period corresponding to 1 cm/s. The gas supply is indicated by an arrow 216.

Discharge parameters and substrate temperature correspond to Example 1, as well as the coating duration. As substrate cylinder material a stainless steel is used which upon cooling shrinks considerably more than tungsten and on which tungsten does not adhere so that the substrate cylinder can easily be drawn out of the formed tungsten cylinders.

What is claimed is:

1. A method for the reactive deposition of tubular bodies of an electrically conductive material from a flowing gas phase on a tubular substrate in which a glow discharge is produced between an inner electrode and an outer electrode, one of which is constructed to be tubular and serves as a substrate, characterized in that (a) a controlled reciprocating movement occurs of the inner electrode relative to the outer electrode, (b) a localized glow discharge zone is produced between the inner electrode and the outer electrode and is maintained during deposition, (c) measures are taken to prevent the formation of electrically conductive layers on electrically insulating structural parts in the reaction space, and (d) the temperature in the substrate area is kept constant at a low value at which the thermal deposition rate is small compared with the deposition rate with glow discharge.

2. A method as claimed in claim 1, characterized in that electrically conductive material is deposited on the inside of the outer electrode to serve as a substrate, said outer electrode being constructed to be tubular and being connected as a cathode.

3. A method as claimed in claim 1, characterized in that electrically conductive material is deposited on the outside of the inner electrode to serve as a substrate, said inner electrode being constructed to be tubular and being connected as a cathode.

4. A method as claimed in claim 1, characterized in that during deposition of multicomponent material in the step (b) and (d) the plasma power consumed in the glow discharge zone is adjusted to be so high with respect to the thermal power supply or removal that the composition of deposited electrically conductive multicomponent material is determined substantially by the relative amounts of constituents to be deposited in the gas phase.

5. A method as claimed in claim 4, characterized in that during the deposition of said multicomponent material the temperature in the substrate area is kept constant at a value at which the thermal deposition rate is at most 1/10 th of the deposition rate with glow discharge.

6. A method as claimed in claim 5, characterized in that the formation of electrically conductive layers on electrically insulating structural parts is prevented in step (c)

(α) by the formation of grooves in the electrically insulating structural parts or of grooves of which at least part of the inside consists of electrically insulating material, said grooves being formed so that during the reactive deposition they are filled substantially only by gaseous reaction end products, (β) by suitable choice of material for electrically insulating structural parts at least at the surface, so that by an etching reaction of the flowing gas phase with the surface of said parts, a gas is formed, and/or (γ) by an additional insert gas rinsing.

7. A method as claimed in claims 1 or 3, characterized in that in step (b) the spatial limitation of the glow discharge zone is adjusted by (α) design and geometric proportioning of the electrode not serving as a substrate and its surface distances to the tubular electrode according to Paschen's law, and/or (β) insulation envelope of the current supply to the inner electrode in so far it does not serve as a substrate, optionally while (γ) forming at least one circumferential groove in the insulation envelope or a groove of which at least part of the inside consists of electrically insulating material, said groove being formed so that during the reactive deposition it is filled substantially only by gaseous reaction end products, and/or (δ) a length of the metallic surface of the electrode not serving as a substrate which in the direction of the tube amounts to less than one third of the length of the substrate.

8. A method as claimed in claim 1, characterized in that in the steps (a) the inner electrode in the direction of the tube is reciprocated along the outer electrode while being moved periodically or aperiodically.

9. A method as claimed in claim 1, characterized in that in step (d) the overall tubular substrate is kept substantially at a constant temperature by individual separately controllable heating and cooling zones, respectively, and/or by choice of a material or a device having a rapid thermal compensation in spite of the local thermal load in the glow discharge zone.

10. A method as claimed in claim 1, characterized in that the tubular substrate is chosen to be cylindrical and the electrode not serving as a substrate is chosen to be rotationally symmetrical, said tubular substrate being optionally stacked from several individual tubular members and the electrode not serving as a substrate being arranged coaxially.

11. A method as claimed in claim 1, characterized in that a non-reacting gas is added to the flowing gas phase.

12. A method as claimed in claim 1, characterized in that the flowing gas phase in case of deposition of a multicomponent material comprises at least a halide or a carbonyl compound of tungsten molybdenum, tantalum, niobium, rhenium, hafnium, iridium, osmium, platinum, rhodium, ruthenium and/or zirconium and as a further constituent at least a metal-organic compound of an element of group III B of the periodic system together with a non-reacting gas and in case a halide is present hydrogen.

13. A method as claimed in claim 1, characterized in that tungsten hexafluoride, hydrogen and at least one metal-organic thorium compound are added to the flowing gas phase and that an electrically conductive material consisting of tungsten, tungsten carbide and thorium oxide is deposited.

14. A method as claimed in claim 11, characterized in that the non-reacting gas is added by two separately controllable gas flow paths, one non-reacting gas supply being carried out by a preheated saturator which is filled with a pulverised metal organic thorium compound.

15. A method as claimed in claim 13 characterized in that rhenium hexafluoride is added to the flowing gas atmosphere.

16. A method as claimed in claim 1, characterized in that a tubular substrate is used which consists of pyrographite, quartz glass, molydenum of copper and that the tubular substrate is removed after the deposition has been completed.

17. A method as claimed in claim 1, characterized in that as a substrate a quartz glass cylinder is used which is precoated thermally by pyrolysis of a metal organic thorium compound with a thin intermediate layer of thorium carbide and carbon not adhering to tungsten, on which the electrically conductive material is then deposited and after completion of the deposition and cooling is removed from the quartz glass tube as a self-supporting cylinder.

18. A method as claimed in claim 1, characterized that the glow discharge is not interrupted in case the gas composition is changed during the deposition process.

* * * * *